(12) United States Patent
Abramson (10) Patent No.: US 11,946,959 B2
(45) Date of Patent: Apr. 2, 2024

(54) DEMARCATING SYSTEM

(71) Applicant: MTD PRODUCTS INC, Valley City, OH (US)

(72) Inventor: Shai Abramson, Pardesiya (IL)

(73) Assignee: MTD Products Inc, Valley City, OH (US)

(*) Notice: Subject to any disclaimer, the term of this patent is extended or adjusted under 35 U.S.C. 154(b) by 0 days.

(21) Appl. No.: 18/087,405

(22) Filed: Dec. 22, 2022

(65) Prior Publication Data
US 2023/0213559 A1    Jul. 6, 2023

Related U.S. Application Data

(63) Continuation of application No. 16/337,674, filed as application No. PCT/IB2017/056038 on Sep. 29, 2017, now Pat. No. 11,536,753.

(30) Foreign Application Priority Data

Sep. 29, 2016 (GB) ..................... 1616587

(51) Int. Cl.
*G01R 19/25*       (2006.01)
*G05D 1/00*        (2006.01)
*G05D 1/02*        (2020.01)

(52) U.S. Cl.
CPC ....... *G01R 19/2509* (2013.01); *G05D 1/0214* (2013.01); *G05D 2201/0208* (2013.01)

(58) Field of Classification Search
CPC ............. G01R 19/2509; G01R 33/02; G05D 1/0214; G05D 2201/0208; G05D 1/0265; A01D 34/008; A01K 15/023; G01S 1/024; G01S 1/68
See application file for complete search history.

(56) References Cited

U.S. PATENT DOCUMENTS

| | | | | |
|---|---|---|---|---|
| 11,536,753 B2* | 12/2022 | Abramson | ............. | G01R 33/02 |
| 2006/0112901 A1* | 6/2006 | Gomez | ................ | A01K 15/023 |
| | | | | 119/721 |
| 2019/0064842 A1* | 2/2019 | Dalfra | .................. | G05D 1/0265 |
| 2019/0218904 A1* | 7/2019 | Fouda | .................. | G01N 27/908 |

* cited by examiner

*Primary Examiner* — Catherine T. Rastovski
*Assistant Examiner* — Yossef Korang-Beheshti
(74) *Attorney, Agent, or Firm* — Wegman Hessler Valore (57) ABSTRACT

A demarcating system is discussed that includes a control system, a wire loop arrangeable by a user to indicate to an object path as part of a boundary of an area: a signal generator controlled by the control system, wherein voltage signals applied by the signal generator to the loop are controlled by the control system; and current sensing circuitry that senses current signals present within the loop wherein processors of the control system analyse such current signals and—operate in a calibration mode to: cause the signal generator to apply to the loop a series of test voltage waveforms that generate corresponding current waveforms within the loop; and analyse the corresponding current waveforms to determine an operating voltage waveform that, when applied to the loop, generates a corresponding operating current waveform with substantially the same shape as a predetermined current waveform.

21 Claims, 3 Drawing Sheets

DEMARCATING SYSTEM

TECHNICAL FIELD

The present invention relates to demarcating systems and, in particular to demarcating systems for indicating the boundary of an area to an object, such as an electronic device (and in particular a robot), a vehicle, or a person or animal (e.g. a pet).

BACKGROUND

Certain demarcating systems may indicate the boundary of an area to an object using a wire loop, through which a current is passed, thus generating an electromagnetic signal that may be received by a receiver associated with the object. The wire loop may be arranged along a path (typically, though not necessarily, a closed path), with this path being indicated to the object as part of, or the entire boundary of the area.

In some cases, the system may allow the user to adjust the length and shape of the wire loop, for example so as to be suitable for demarcating the boundary of a particular area. The Applicant has recognised that this may pose challenges to the reliability of the system, since the signal received by the receiver associated with the object may vary as a result of changes in the length and shape of the wire loop.

SUMMARY

Aspects of the invention are set out in the appended claims.

The following disclosure describes a demarcating system for indicating the boundary of an area to an object, the object having a receiver for receiving electromagnetic signals. The system comprises: a control system comprising one or more processors; a wire loop, which may be arranged by a user along a path, so that said path is indicated to the object as at least part of the boundary of the area, the length of the wire loop being adjustable by the user; a signal generator, which is electrically connected to the wire loop so as to be operable to apply voltage signals thereto, which cause the emission of corresponding electromagnetic boundary indicating signals from the wire loop for receipt by the receiver of the object, the signal generator being under the control of the control system such that the voltage signals applied by the signal generator to the wire loop are controlled by the control system; current sensing circuitry, which is electrically connected to the wire loop so as to sense current signals present within the wire loop and which is connected to the control system so that its processors can analyse current signals present within the wire loop.

The one or more processors are programmed to operate in a calibration mode whereby they: cause the signal generator to apply a series of test voltage waveforms to the wire loop, each of the test voltage waveforms generating a corresponding current waveform within the wire loop; and analyse the series of corresponding current waveforms, as sensed by the current sensing circuitry, so as to determine an operating voltage waveform that, when applied to the wire loop, generates a corresponding operating current waveform that, when normalized, is substantially the same as a predetermined current waveform.

In some embodiments, the voltage and current waveforms may be periodic waveforms, for example consisting of a cycle that is repeated continuously (e.g. sine waves, square waves, triangular waves, sawtooth waves, and the like). In addition, or instead, the voltage and current waveforms may be bipolar, having significant positive and negative portions. Additionally, or alternatively, they may be polarity asymmetric, so that the negative portions are differently shaped to the positive portions.

BRIEF DESCRIPTION OF THE DRAWINGS

The invention will now be described with reference to the drawings, in which.

DETAILED DESCRIPTION OF THE DRAWINGS

Figure 1:
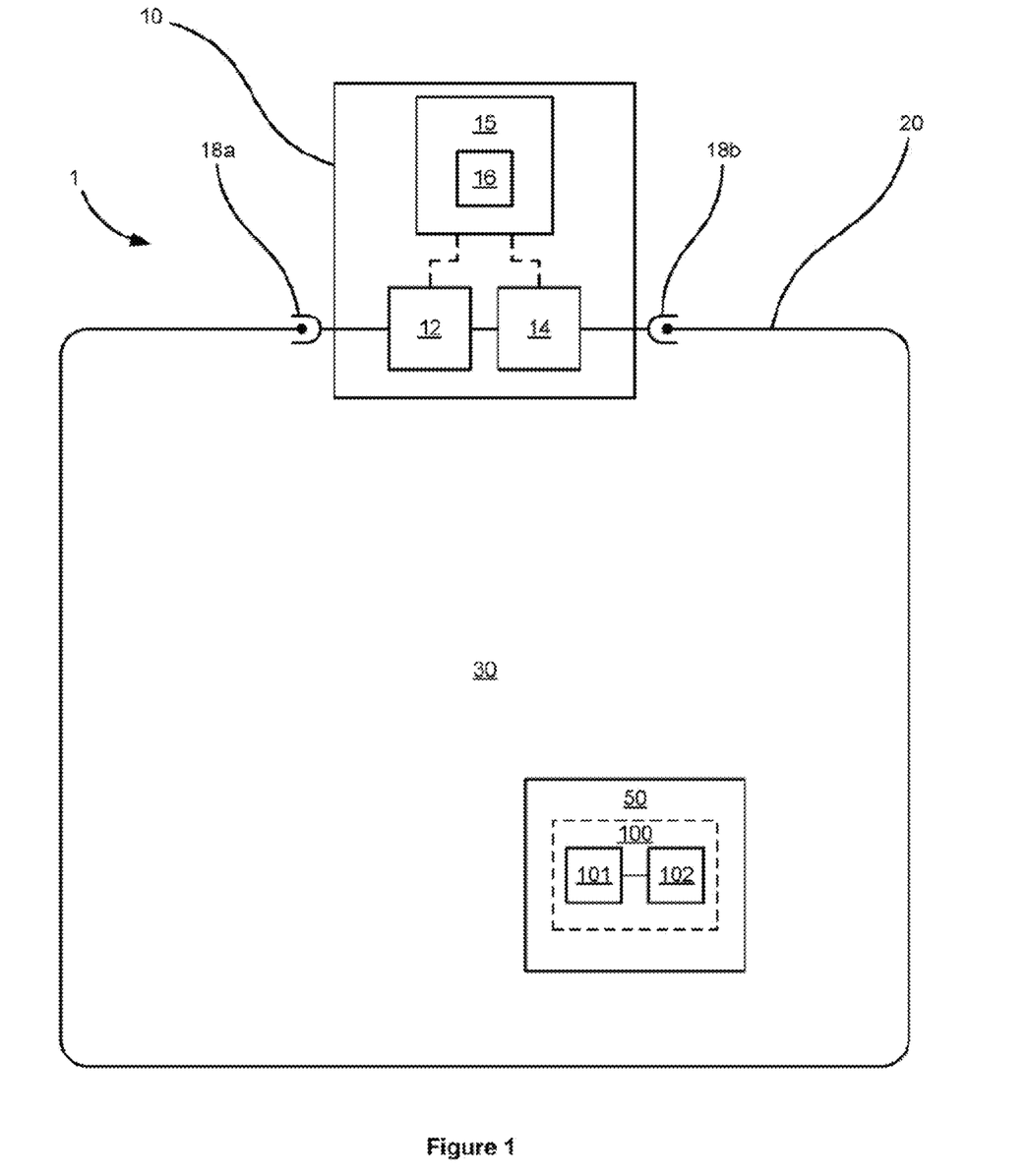
FIG. 1 is schematic diagram of a demarcating system according to an example embodiment of the present invention.

Turning first to FIG. 1, there is shown a schematic diagram of a demarcating system 1 according to an example embodiment of the present invention.

The demarcating system 1, when activated, indicates to an object 50 the boundary 20 of an area 30. The object may be an electronic device, and in particular a robot, such as a robotic lawnmower; a vehicle; or a person or animal (e.g. a pet).

As may be seen from the drawing, the demarcating system includes a wire loop 20, a signal generator 12, current sensing circuitry 14, and a control system 15.

As illustrated in the drawing, the wire loop 20 has been arranged by a user along a path. As a result, the path of the wire loop 20 is indicated to the object 50 as the boundary of the area (or a part thereof). Where the object 50 is a robotic lawnmower, the wire loop 20 may, for example, indicate to the robot the path of at least part of a boundary of an area to be mowed.

The length and shape of the wire loop 20 may be adjusted by the user, for example so as to be suitable for a particular area of interest. For instance, as shown in FIG. 1, the user may cut the wire to a desired size and then connect it to connectors 18a, 18b, thereby electrically connecting the wire loop 20 to the signal generator 12 and the current sensing circuitry 14. It will of course be appreciated that this is merely one example of how the wire loop 20 may be electrically connected to the signal generator 12 and current sensing circuitry 14 and that a wide variety of other arrangements to provide such electrical connection are possible.

When the system is activated, the signal generator 12 applies voltage signals to the wire loop 20, with these voltage signals causing the emission of corresponding electromagnetic boundary indicating signals from the wire loop 20 that may then be received by a receiver 101 associated with the object 50. Specifically, the voltage signals generate corresponding current signals in the wire loop 20, with these current signals in turn produce a time-varying magnetic field in the vicinity of the wire loop 20—and in particular the in the area 30—as well as an associated time-varying electric field; thus, electromagnetic boundary indicating signals are emitted by the wire loop 20.

As shown in FIG. 1, the receiver 101 may form a part of a receiving system 100 associated with the object 50. As also shown in FIG. 1, this receiving system 100 may further include one or more processors 102 that are connected to the receiver so that they can analyse the electromagnetic signals received by the receiver 101.

The receiver 101 of the receiving system 100 may, for example, be configured to sense the (time-varying) magnetic field component of the electromagnetic boundary indicating signals that are emitted by the wire loop 20: the magnetic field component will typically be more easily sensed than the electric field component, given the respective shapes of the magnetic and electric fields within the area 30. In order to sense the magnetic field component (or otherwise), the receiver may include one or more conductive coils.

As indicated in FIG. 1 by the dashed line linking the signal generator 12 and the control system 15, the signal generator is under the control of the control system 15, which, as may also be seen from FIG. 1, includes at least one processor 16. As a result, the voltage signals applied by the signal generator 12 to the wire loop 20 are controlled by the control system 15. For instance, the signal generator 12 and the control system 15 may have an electrical or wireless connection that allows control signals to be sent to the signal generator 12, with these control signals specifying the voltage signals that the signal generator 12 should apply to the wire loop 20.

The electrical connection of the current sensing circuitry 14 to the wire loop 20 enables the current sensing circuitry 14 to sense current signals present within the wire loop 20. Where the receiver 101 of the receiving system 100 is configured to sense the (time-varying) magnetic field component of the electromagnetic boundary indicating signals emitted by the wire loop 20, the current signals present within the wire loop 20 may be of particular importance, since these will directly determine the magnetic field component of the electromagnetic boundary indicating signals.

The current sensing circuitry 14 may, for example, be electrically connected in series with the wire loop 20, as illustrated in FIG. 1. As indicated by the dashed line in FIG. 1 linking the current circuitry 14 to the control system 15, the current circuitry 14 is connected to the control system 15 so that the processor(s) 16 of the control system 15 can analyse current signals present within the wire loop 20.

In one example, the current sensing circuitry 14 may include a resistor having a known resistance (which resistor may be designed so that this value is insignificant in comparison to other sources of resistance within the circuit that includes the wire loop 20), with a lead from each end of the resistor being connected to a respective input to the processor(s) 16. Hence (or otherwise), the processor(s) 16 may determine the potential difference across the resistor and, using the known resistance value, the current present within the wire loop 20. In this example, the processor(s) 16 may be viewed as providing part of the current sensing circuitry 14; this may also be the case in other examples of current sensing circuitry 14.

In another example, the current sensing circuitry 14 may include a resistor having a known resistance (which resistor may again be designed so that this value is insignificant in comparison to other sources of resistance within the circuit that includes the wire loop 20), and a voltage sensor electrically connected to the resistor so as to sense the voltage across it. This voltage sensor may then be connected to the control system 15 (for example by an electrical or wireless connection) such that it can send data to the control system 15 concerning the voltage across the resistor, and, because the value of its resistance is known, thus the current signals present in the wire loop. In such examples of current sensing circuitry an analogue-to-digital converter may optionally be included that converts the analogue voltage signal into a digital signal for processing by the processor(s) 16. In other examples, analogue-to-digital converters may likewise be included so as to, for example, convert analogue current or voltage signals into corresponding digital signals for processing by the processor(s) 16.

In a still further example, the current sensing circuitry 14 may include a Hall effect current sensor. Such current sensing circuitry 14 may suitably introduce negligible additional resistance to the circuit including the wire loop 20. The output from this Hall effect current sensor may, for example, be provided directly to the processor(s) 16, or, in another example, be passed to an analogue-to-digital converter, which then provides an output to the processor(s) 16.

In the particular example illustrated in FIG. 1, the signal generator 12, current sensing circuitry 14, and the control system 15 are all provided within a base station 10. As also shown in FIG. 1, the connectors 18a, 18b for electrically connecting the wire loop 20 to the signal generator 12 and current sensing circuitry 14 may be provided on the exterior of the base station.

In examples where the object 50 is a robot (and potentially in other examples), this base station 10 may optionally function as a charging station, to which the robot (or, more generally, the object 50) returns periodically to recharge its internal power source using power provided by the charging station.

The processor(s) 16 of the control system 15 may be programmed to operate in a number of modes. In each of these modes the control system 15 may command components of the demarcating system that are under its control (such as the signal generator 12) to operate in accordance with rules and procedures that are associated with the mode selected by the user.

Calibration Mode

In particular, it is envisaged that the processor(s) 16 are programmed to operate in a calibration mode. This may, for example, be utilised to adjust the voltage signals generated by the signal generator 12 in such a way that the electromagnetic signals produced by the wire loop 20 and received at a point within area 30 have a desired shape (when considered with respect to time). In other words, the electromagnetic signals produced by the wire loop 20 and received at a point within area 30, when normalized, are substantially the same as a desired electromagnetic signal.

With a number of types of receiving systems 100, in order for the electromagnetic signal received by the receiver 101 to be correctly analysed by the receiving system 100 (e.g. by the processor(s) 102), it may be important that the electromagnetic signal has a specific shape when considered with respect to time. For example, where the receiver 101 of the receiving system 100 is configured to sense the time-varying magnetic field component of the electromagnetic boundary indicating signals emitted by the wire loop 20, it may be important that the magnetic field component has a specific shape.

However, changes made by the user to the length and/or shape of the wire loop are likely to affect the shape of the electromagnetic signal produced by the wire loop. For instance, changes to the length of the wire loop 20 will tend to alter the resistance and impedance of the wire loop: increasing the length of the wire loop 20 will tend to increase both its impedance and resistance, whereas decreasing the length of the wire loop 20 will tend to decrease both its impedance and resistance. Further, changes to the shape of the wire loop 20 may alter its impedance, even if its length remains the same.

It should be noted that, it may be of lesser importance what this specific signal shape is (a variety of signal shapes may be appropriate, for instance amplitude modulation, frequency modulation, pulses etc. may be utilised) than it is that the signal shape is substantially the same regardless of how the user has set up the loop, for example in terms of its length and shape.

Figure 2A:
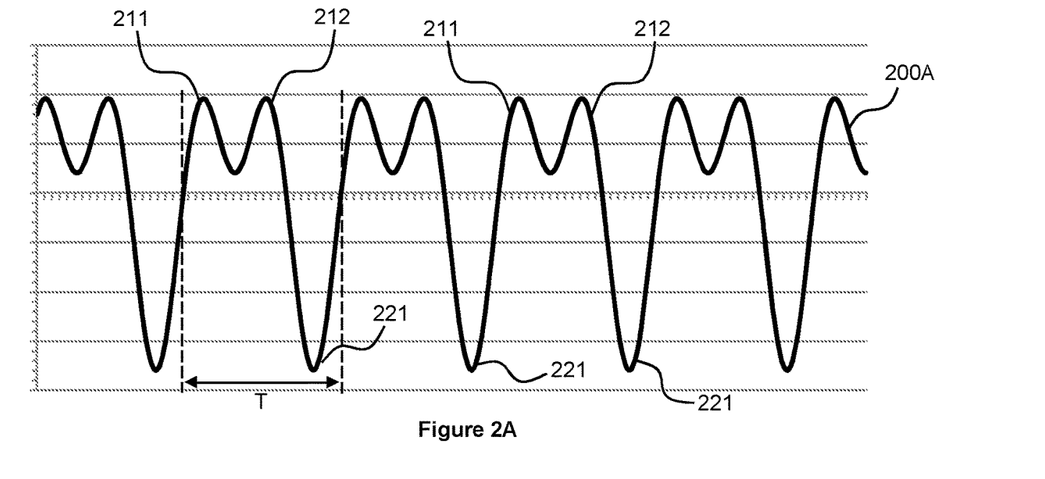
FIG. 2A is a graph showing an example of a desired current waveform for a wire loop.

Nonetheless, solely for the purposes of illustration, attention is directed to FIG. 2A, which is a graph showing an example of a suitable current waveform that it is desired to apply to the wire loop 20; current is shown on the ordinate and time on the abscissa. As may be seen, the waveform 200A consists of a cycle that is repeated continuously with period T (indicated in the drawing by a double-headed arrow). The specific example shown is a combination of a sine wave with a cosine wave having double the frequency.

It may be noted that the waveform 200A is polarity asymmetric; thus, the negative portions are differently shaped to the positive portions. In addition, the waveform 200A is bipolar, having significant positive and negative portions. Waveforms that are bipolar and polarity asymmetric may be useful in enabling the receiving system 100 to determine whether the object 50 is inside or outside of the area 30, as the signal received by the object's receiver 101 will typically differ substantially depending on whether it is inside or outside of the area 30.

Furthermore, it may be noted that in the particular example shown, a complete cycle of the current waveform has a different number of positive 211, 212 and negative 221 peaks. Specifically, a complete cycle has two positive peaks 211, 212 and only one negative peak 221. Having a different number of positive and negative peaks may assist the processor(s) 102 of the receiving system 100 in determining whether the object 50 is inside or outside of the area. For example, the processor(s) 102 of the receiving system 100 may count the number of positive and/or negative peaks during a given time interval, or they may determine the number of times the signal exceeds a certain threshold.

Figure 2B:
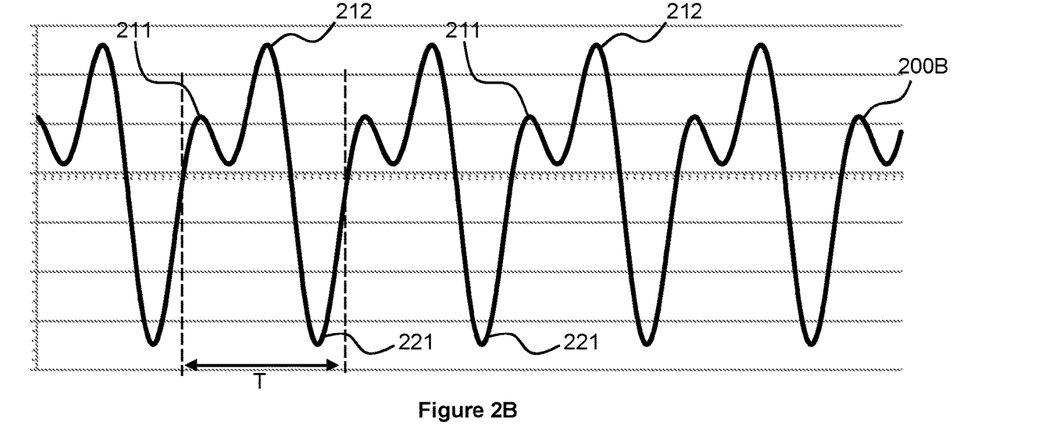
FIG. 2B is a graph showing a distorted version of the current waveform of FIG. 2A.

Turning now to FIG. 2B, shown is a graph showing a distorted version 200B of the current waveform 200A of FIG. 2A. The same operating voltage waveform as in FIG. 2A is provided by the signal generator 12, but the user has set up the wire loop differently 20, resulting in a change to the impedance and resistance of the wire loop 20 and a corresponding distortion of the current waveform 200B, as compared with that of FIG. 2A. Specifically, the cosine component has been phase-shifted.

Nonetheless, despite the distortions of the current waveform 200B, each complete cycle still includes two positive peaks 211, 212 and one negative peak 221. Thus, the receiving system 100 may still successfully determine whether the object 50 is inside or outside of the area 30.

Figure 2C:
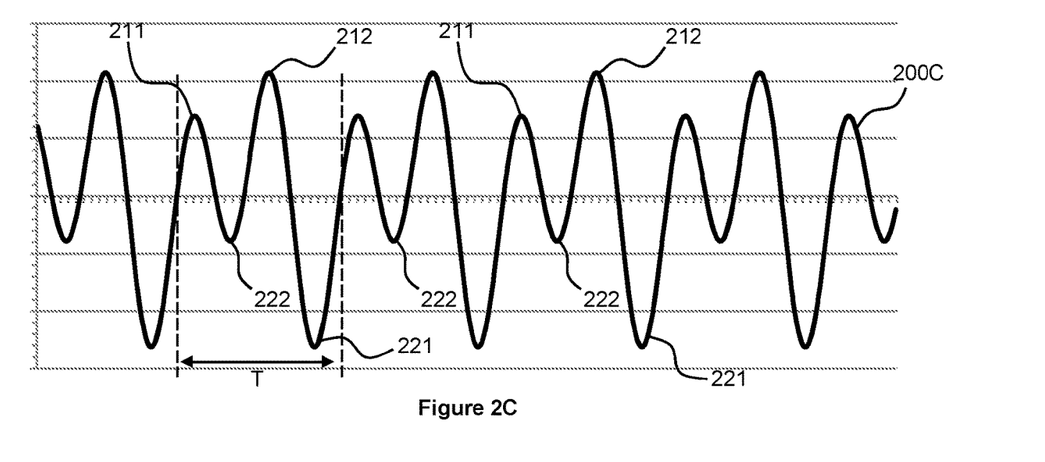
FIG. 2C is a graph showing a further distorted version of the current waveform of FIG. 2A.

FIG. 2C is a graph showing a further distorted version 200C of the current waveform 200A of FIG. 2A. The same operating voltage waveform as in FIG. 2A and FIG. 2B is provided by the signal generator 12, but the user's set up of the wire loop 20 has resulted in still greater distortion of the current waveform 200C. As may be seen, the current waveform is sufficiently distorted that each complete cycle includes two positive peaks 211, 212 and two negative peaks 221, 222. As a result, it may be problematic for the receiving system 100 to determine whether the object 50 is inside or outside of the area 30.

The calibration mode may enable the demarcating system to diminish distortions of the current waveform, such as those illustrated in FIGS. 2A-2C, that are caused by the particular user setup of the wire loop 20 (it being recognised that the current waveforms 200A-C and the way in which the receiving system 100 of the object 50 operates are merely illustrative and that a wide range of waveforms are suitable for use with demarcating systems as described herein).

Accordingly, in the calibration mode, the processor(s) 16 of the control system 15 determine(s) an operating voltage waveform that, when applied to the wire loop 20, may be expected to generate an operating current waveform having the same shape as a predetermined current waveform. When this predetermined current waveform is present within the wire loop 20, the wire loop 20 emits electromagnetic signals having a desired shape with respect to time. In particular, it should be understood that the shape of the time-varying magnetic component of such electromagnetic signals will closely correspond to the shape of the current signals present within the wire loop 20.

This predetermined current waveform will typically be predefined in the demarcating system prior to delivery to the user, though in some cases the system could enable the user to define the current waveform. For instance, the predetermined current waveform may be pre-programmed in the processor(s) 16 or the signal generator 12, or stored on data storage forming part of the control system 15 or another part of the demarcating system 1.

In order to determine such an operating voltage waveform, the control system 15 (specifically, the processor(s) 16 thereof) causes the signal generator 12 to apply a series of test voltage waveforms to the wire loop 20. Each of these test voltage waveforms generates a corresponding current waveform within the wire loop 20. The current sensing circuitry 14, as a result of its electrical connection to the wire loop 20, is able to sense the series of corresponding current waveforms. The processor(s) 16 of the control system 15 are, in turn, able to analyse them, as a result of the connection between the control system 15 and the current sensing circuitry 14. By analysing the series of current waveforms, the processor(s) 16 are able to determine an operating voltage waveform that results in the generation within the wire loop 20 of an operating current waveform with the desired shape and, in consequence, the emission from the wire loop 20 of electromagnetic signals of the desired shape.

It will be noted that the operation of the demarcating system 1 in such a calibration mode does not require the involvement of the receiver 101 (or, more generally, the receiving system 100). A possible consequence is that the calibration may be more accurate, since communication over the—not yet calibrated—channel provided by the wire loop 20 and the receiver 101 does not need to be utilised.

In some cases, in the calibration mode the processor(s) 16 may determine an operating voltage waveform that results in an operating current waveform with not only the same shape as a predetermined current waveform, but also the same magnitude. Thus, in such cases, the operating current waveform is substantially the same as the predetermined current waveform. This might, for example, be of benefit where the receiving system 100 utilises the strength of the electromagnetic signal received by its receiver 101 (e.g. the strength of the magnetic field component) to determine an estimate of its distance (and therefore the distance of the object 50) from the boundary. More generally, this might be utilised to ensure that the electromagnetic signals emitted by the wire loop 20 have sufficient strength to be reliably received at some predefined, or user-defined, distance from the wire loop 20.

In some cases, each of the series of test voltage waveforms utilised in the calibration mode may be substantially sinusoidal. This may in some cases simplify the analysis of the corresponding series of current signals by the processor(s) 16, since the response of circuits to sinusoidal signals is generally more straightforward to represent using algebraic expressions.

Furthermore, where the circuit can be assumed to behave approximately linearly (which assumption will be valid in a number of cases) the effects of such sinusoidal test voltage waveforms may be assumed to sum linearly. In addition, the application of a sinusoidal voltage waveform may be assumed to result in a sinusoidal current waveform of the same frequency. A possible consequence is that the determination of a suitable operating voltage waveform (one that when applied to the wire loop 20 generates a corresponding operating current waveform of desired shape), may become more straightforward.

More particularly, where the test waveforms utilised in the calibration mode are substantially sinusoidal, the processor(s) 16 may, for example, be programmed to carry out a frequency domain linear transformation of the predetermined current waveform (whose shape we are seeking to match). For instance, the linear transformation may be a Fourier transform or a Laplace transform.

Such a frequency domain linear transformation (e.g. a Fourier transform) may allow the predetermined current waveform I(t) to be represented as the superposition of n sinusoidal current waveforms, each of which has a respective frequency $f_k$, phase shift $\theta_k$, and weighting coefficient or amplitude value $B_k$ (with the index k identifying the sinusoidal waveform in question). Thus:

$$I(t) = \sum_{k=1}^{n} B_k \sin(2\pi f_k t + \theta_k)$$

It should be understood however that such a representation of the predetermined current is by no means reliant upon the use of a frequency domain linear transformation. For instance, the parameter values of the sinusoidal current waveforms ($f_k, \theta_k$ and $B_k$) may simply be predefined or pre-programmed in the demarcating system (this being an example of the predetermined current waveform being pre-programmed into the demarcating system prior to delivery to the user). For example, these values may be pre-programmed in the processor(s) 16 or the signal generator 12, or stored on data storage forming part of the control system 15 or another part of the demarcating system 1.

Where the predetermined current waveform I(t) can be represented as the superposition of n sinusoidal current waveforms, the operating voltage waveform may, in some cases, similarly be represented as the superposition of n sinusoidal voltage waveforms. It will be understood that n will be at least 2 and, where a frequency domain linear transformation has been carried out, may be large, e.g. more than 100; however, particularly where the sinusoidal current waveforms are predefined or pre-programmed n may conveniently be less than or equal to 10 (and in some cases may be less than or equal to 5), so as to simplify the calculations.

More particularly, each of these n sinusoidal voltage waveforms may have a respective phase shift $\psi_k$, and amplitude value $A_k$, as well as having the same frequency $f_k$ as a respective one of the n sinusoidal current waveforms. Thus:

$$V(t) = \sum_{k=1}^{n} A_k \sin(2\pi f_k t + \psi_k)$$

In such cases, the determination of a suitable operating voltage waveform may, for example, involve the processor(s) 16 analysing the series of current waveforms that result from the series of test voltage waveforms so as to determine suitable parameter values (e.g. phase shift and amplitude values $\psi_k, A_k$) for the sinusoidal voltage waveforms of the operating voltage waveform. A number of approaches may be employed to determine these parameter values. Below there are described two detailed examples of suitable approaches.

First Example Approach

In the first example approach, each of the test voltage waveforms is sinusoidal and has the same frequency, $f_k$, as a respective one of the n sinusoidal current waveforms. Thus, the kth test voltage waveform, $v_k(t)$, is given by:

$$v_k(t) = a_k \sin(2\pi f_k t)$$

When such a test voltage waveform is applied to the wire loop, it may be expected that the resulting current signal will be given by:

$$i_k(t) = \frac{a_k}{Z_k} \sin(2\pi f_k t + \Phi_k)$$

Where $Z_k$ is an impedance value and $\Phi s_k$ is a phase shift value for the frequency in question. It should be appreciated that such values may be determined empirically by analysing the series of current waveforms $i_k(t)$. For example, $\Phi_k$ may be determined by calculating the phase difference between $v_k(t)$ and $i_k(t)$, whereas $Z_k$ may be determined by calculating the ratio between the peak voltage value and the peak current value (or the ratio between the RMS values, the peak-to-peak values etc.).

The thus-determined impedance and phase shift values $Z_k, \Phi_k$ may then be used to determine suitable parameter values (e.g. phase shift and amplitude values $\psi_k, A_k$) for the sinusoidal voltage waveforms of the operating voltage waveform V(t).

For example, if we know that the kth test voltage waveform results in a phase shift of $\Phi_k$ and we are seeking a suitable phase shift $\psi_k$ for the kth sinusoidal voltage waveform of the operating voltage waveform V(t) such that the corresponding kth sinusoidal current waveform will have a phase shift value of $\theta_k$, then the phase shift produced by the kth test voltage waveform, $\Phi_k$, may simply be subtracted from the desired phase shift value, $\theta_k$. Thus:

$$\psi_k = \theta_k - \Phi_k$$

Similarly, if we know that the kth test voltage waveform results in a current of amplitude $a_k/z_k$ and we are seeking a suitable voltage amplitude value $A_k$ for the kth sinusoidal voltage waveform of the operating voltage waveform V(t)

such that the corresponding kth sinusoidal current waveform will have an amplitude of $B_k$, then $A_k$ should be equal to $B_k$ multiplied by the impedance value $Z_k$. Thus:

$$A_k = Z_k B_k$$

Accordingly, the operating voltage waveform V(t) may be expressed as:

$$V(t) = \sum_{k=1}^{n} Z_k B_k \sin(2\pi f_k t + \theta_k - \Phi_k)$$

It should be noted that the number m of test voltage waveforms $v_k(t)$ may be different to, for example less than, the number n of sinusoidal voltage waveforms of the operating voltage waveform V(t) (also the number of sinusoidal current waveforms of the predetermined current waveform I(t)).

Thus, where m<n there will (generally speaking) be certain frequencies $f_k$ for which there is no associated test waveform and, therefore, no associated impedance and phase shift values $Z_k$, $\Phi_k$ that have been determined empirically. Hence, (or otherwise) suitable impedance and phase shift values $Z_k$, $\Phi_k$ for those frequencies may be determined, for example by analysing the impedance and phase shift values $Z_k$, $\Phi_k$ for other frequencies, e.g. by interpolation and/or extrapolation of the empirically-determined values. Such an approach may be particularly appropriate where n is large.

Second Example Approach

In the second example approach, the test voltage waveforms sweep over a frequency range from $f_{min}$ to $f_{max}$ in order to identify a resonant frequency within this range. Accordingly, each of the series of test voltage waveforms has substantially the same shape, but a different respective frequency.

The resonant frequency will, in many cases, depend on the respective values for the sources of inductance, capacitance and resistance within the same circuit as the wire loop 20. In some cases, for example with sinusoidal waveforms, this relationship may be described by a relatively simple algebraic relation (as will be discussed below). Nonetheless, in other cases, it may still be possible to find at least an empirical relationship based on these values (or perhaps a more complex algebraic relation).

A value for the capacitance of the circuit may be known, for example by testing prior to shipping to the customer, since variations in the wire loop typically will not alter the capacitance of the circuit.

A value for the resistance in the circuit may be determined empirically, for example by calculating, measuring or otherwise determining the impedance at the resonant frequency, $Z(f_0)$. It should be noted however that the value of R might also be determined by other means, for example applying a DC voltage signal to the circuit and measuring the impedance, which may be substantially equal to the resistance.

In some embodiments, therefore, the processor(s) 16 of the control system 15 may determine the operating voltage waveform using such values. For instance, using a formula or look-up table based on such values.

In a specific implementation of the second example approach, the test voltage waveforms are sinusoidal. (which are again sinusoidal) sweep over a frequency range from $f_{min}$ to $f_{max}$. Thus, each of the test voltage waveforms is sinusoidal and has a respective frequency, with the frequencies of the series of test voltage waveforms being distributed over this frequency range. For instance, frequencies may substantially equally distributed over the frequency range, with consecutive frequencies differing by a substantially constant amount.

According to the second approach, the current waveforms corresponding to the test waveforms are analysed so as to identify the resonant frequency $f_0$ for the demarcating system. A sinusoidal voltage waveform having this frequency will produce a current waveform having the maximum amplitude (as compared with sinusoidal voltage waveforms having other frequencies within the test range).

It should be noted that the system may not actually generate a test voltage waveform having exactly the resonant frequency $f_0$. Rather, interpolation may be used to identify the frequency $f_0$ at which the amplitude of the current waveform is expected to be at a maximum.

A number of sweeps of the frequency range (or portions thereof) may be carried out. For instance, a first sweep might start at an end-point of the frequency range (either $f_{min}$ or $f_{max}$), with a succession of test voltage waveforms being applied whose frequencies are spaced apart by a first amount. Once a turning point has been reliably detected, for instance where the current amplitude has been steadily increasing with each consecutive test voltage waveform and then decreases steadily for a number of consecutive test voltage waveforms, a second sweep over a smaller portion of the frequency range may be carried out, with a succession of test voltage waveforms being applied whose frequencies are spaced apart by a second, smaller amount. Again, this may continue until a turning point has been reliably detected, whereupon a further sweep may be carried out, or a value for the resonant frequency $f_0$ may be calculated by interpolating the available data.

Thus, a plurality of sweeps of portions of the frequency range may be carried out, for example with each portion being narrower than the previous portion. In addition (or instead), the spacing of frequencies within each sweep may be smaller than that in the previous sweep.

It should be noted that the end-point values of the frequency range, $f_{min}$ and $f_{max}$ may be predetermined, for example based on the likely minimum and maximum lengths for the wire loop 20.

Once a value for the resonant frequency $f_0$ has been calculated, this may be utilised to determine a suitable operating voltage waveform (one that when applied to the wire loop 20 generates a corresponding operating current waveform of desired shape). It should be appreciated that, in many cases, the resonant frequency $f_0$ will be related to the respective values for the sources of inductance, capacitance and resistance within the same circuit as the wire loop 20 according to an algebraic relation.

Further, the impedance for a sinusoidal voltage waveform having a particular frequency Z(f) will also, in many cases, be related to the respective values for the sources of inductance, capacitance and resistance within the same circuit as the wire loop 20 according to an algebraic relation. Similarly, the phase difference $\Phi(f)$ between a sinusoidal voltage waveform and its corresponding sinusoidal current waveform will also, in many cases, be related to the respective values for the sources of inductance, capacitance and resistance within the same circuit as the wire loop 20 according to an algebraic relation.

Accordingly, in a number of cases it is possible to derive an algebraic expression for each of the impedance Z(f) and the phase difference $\Phi(f)$ at frequency f, in terms of the frequency in question f, the resonant frequency $f_0$, and one or more known values corresponding to the other sources of resistance and/or capacitance within the same circuit as the wire loop 20. Hence (or otherwise), it may be possible to determine suitable parameter values (e.g. phase shift and amplitude values $\psi_k$, $A_k$) for the sinusoidal voltage waveforms of the operating voltage waveform using such known values and the calculated value of the resonant frequency $f_0$.

Figure 3:
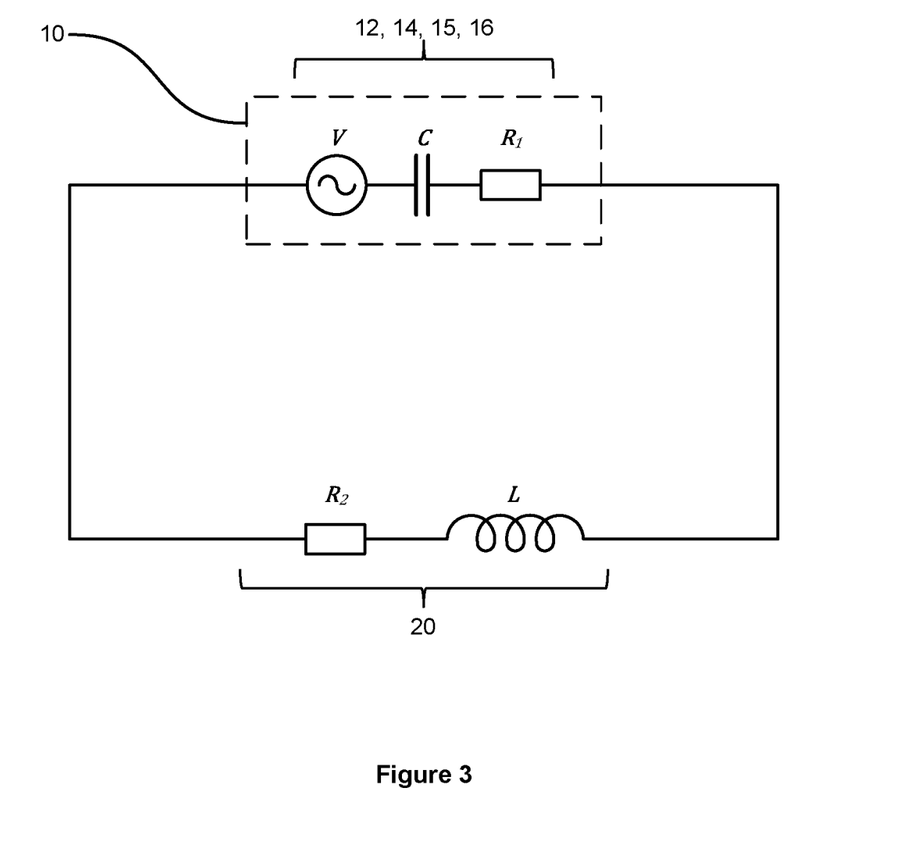
FIG. 3 is a circuit diagram representing an approximation of the demarcating system shown in FIG. 1.

A specific example of this will now be described with reference to FIG. 3, which is a circuit diagram representing an approximation of the demarcating system shown in FIG. 1. According to the approximation shown in the diagram, the components other than the wire loop 20, such as the signal generator 12, the current sensing circuitry 14 and the control system 15 may be represented as a combination of a resistor (with resistance $R_1$), a capacitor (with capacitance C) and a voltage source (having a time-varying voltage V) connected in series. As discussed above, the signal generator 12, the current sensing circuitry 14 and the control system 15 may be provided within a base station 10, which is indicated in the drawing using dashed lines. Further, according to the approximation shown in FIG. 3, the wire loop 20 may be represented as a combination of a resistor (with resistance $R_2$) and inductor (with inductance L).

This approximation will be valid in a number of cases since the wire loop 20 will often be the dominant source of inductance within the circuit and, by contrast, the wire loop 20 will often provide negligible capacitance in comparison with other components within the same circuit, such as the signal generator 12, current sensing circuitry 14 etc.

For such a circuit, the impedance Z(f) at frequency f, is given by:

$$Z(f) = \sqrt{R^2 + \left(\frac{1}{2\pi f C} - 2\pi f L\right)^2} \tag{1}$$

Where R is the total resistance, and thus: $R = R_1 + R_2$.

The phase difference $\Phi(f)$ between (sinusoidal) voltage and current signals of frequency f is given by:

$$\Phi(f) = \tan^{-1}\left(\frac{\frac{1}{2\pi f C} - 2\pi f L}{R}\right) \tag{2}$$

At the resonant frequency $f_0$ the impedance is at a minimum and thus:

$$\frac{1}{2\pi f_0 C} = 2\pi f_0 L; \text{ and} \tag{3}$$

$$Z(f_0) = R. \tag{4}$$

Accordingly, the value of R may be determined empirically, for example by calculating, measuring or otherwise determining the impedance at the resonant frequency, $Z(f_0)$. It should be noted however that the value of R might also be determined by other means, for example applying a DC voltage signal to the circuit and measuring the impedance, which may be substantially equal to the resistance.

Further, if the value of C is known (for example by testing prior to shipping to the customer, since variations in the wire loop typically will not alter the capacitance of the circuit), equation 3 may be rearranged to give L in terms of known values $f_0$ and C:

$$L = \frac{1}{(2\pi f_0)^2 C} \tag{5}$$

Such a known value for C might be stored or predefined within the control system 15, for example by being stored on data storage forming part of the control system 15, or by being predefined within the programming of the processor(s) 16.

Equation 5 may be substituted into equations 1 and 2 to give expressions for Z(f) and $\Phi(f)$ in terms of known values $f_0$, R and C:

$$Z(f) = \sqrt{R^2 + \left(\frac{f_0^2 - f^2}{2\pi f_0^2 f R C}\right)^2}$$

$$\Phi(f) = \tan^{-1}\left(\frac{f_0^2 - f^2}{2\pi f_0^2 f R C}\right)$$

If we know that a sinusoidal voltage waveform of frequency f results in a phase shift of $\Phi(f)$ and we are seeking a suitable phase shift $\psi_k$ for the kth sinusoidal voltage waveform of the operating voltage waveform V(t) such that the corresponding kth sinusoidal current waveform will have a phase shift value of $\theta_k$, then the phase shift for frequency $f_k$, $\Phi(f_k)$, may simply be subtracted from the desired phase shift value, $\theta_k$. Thus:

$$\psi_k = \theta_k - \Phi(f_k)$$

Similarly, if we know that a sinusoidal voltage waveform of frequency f results in a current amplitude that is scaled by a factor $$\frac{1}{Z(f)}$$

and we are seeking a suitable voltage amplitude value $A_k$ for the kth sinusoidal voltage waveform of the operating voltage waveform V(t) such that the corresponding kth sinusoidal current waveform will have an amplitude of $B_k$, then $A_k$ should be equal to $B_k$ multiplied by the impedance value $Z(f_k)$ for frequency $f_k$. Thus:

$$A_k = Z(f_k) B_k$$

Accordingly, it is possible to determine suitable parameter values (e.g. phase shift and amplitude values $\psi_k$, $A_k$) for the sinusoidal voltage waveforms of the operating voltage waveform.

The operating voltage waveform V(t) may therefore be expressed as:

$$V(t) = \sum_{k=1}^{n} Z(f_k) B_k \sin(2\pi f_k t + \theta_k - \Phi(f_k))$$

Or, more fully:

$$V(t) = \sum_{k=1}^{n} B_k \sqrt{R^2 + \left(\frac{f_0^2 - f_k^2}{2\pi f_0^2 f_k RC}\right)^2} \sin\left(2\pi f_k t + \theta_k - \tan^{-1}\left(\frac{f_0^2 - f_k^2}{2\pi f_0^2 f_k RC}\right)\right)$$

It should be noted that these equations are simply one specific example of how to derive an algebraic expression for each of the impedance Z(f) and the phase difference Φ(f) at frequency f, in terms of the frequency in question f, the resonant frequency $f_0$, and one or more known values corresponding to the other sources of resistance and/or capacitance within the same circuit as the wire loop 20 and how to determine suitable parameter values (e.g. phase shift and amplitude values $\psi_k$, $A_k$) for the sinusoidal voltage waveforms of the operating voltage waveform using such known values and the calculated value of the resonant frequency $f_0$. Accordingly, it should be appreciated that a number of other examples are possible, with the specific algebraic expressions depending on the components and topology of the circuit that the wire loop 20 forms part of.

Comparison of the First and Second Example Approaches

It should be noted that the first example approach may, in some cases, require relatively more accurate timing measurements to find the phase shift between the voltage and current. The second example approach may therefore be somewhat simpler to implement and more robust, as it requires only current measurements and also the peak frequency accuracy is less critical.

Activating the Calibration Mode

The processor(s) 16 may be programmed so as enter the calibration mode in response to the occurrence of certain events, which are defined within their programming. In one example, processor(s) 16 may be programmed so as enter the calibration mode upon initialization of the demarcating system, for instance every time the user turns on the demarcating system. In another example, the processor(s) 16 may be programmed so as enter the calibration mode upon receipt by the system of a user command, for instance provided using a user interface on the base station 10, or provided wirelessly (e.g. from the user's smart phone, tablet or other computing device). In another example, the processor(s) 16 may be programmed so as enter the calibration mode periodically, for instance every day (preferably at a time that the user is unlikely to be using the system).

Demarcating Mode

Once the demarcating system has been calibrated (for example according to one of the approaches described above) so as to determine a suitable operating voltage waveform, the processor(s) 16 may be programmed so as to enter a demarcating mode. In such a demarcating mode, the processor(s) 16 may cause the signal generator 12 to apply the operating voltage waveform to the wire loop, which causes the emission of a corresponding electromagnetic boundary indicating signal from the wire loop for receipt by the receiver 101 of the object 50. In a particular example, the receiver 101 of the receiving system 100 may, be configured to sense the time-varying magnetic field component of the electromagnetic boundary indicating signals emitted by the wire loop 20.

The processor(s) 102 of the receiving system 100 may be programmed so as to determine the location of the object 50 relative to the boundary indicated by the wire loop 20, using the received electromagnetic signals. For instance, they may be able to determine whether the object 50 is inside of, or outside of the boundary indicated by the wire loop 20 and/or to determine an estimate of the object's distance from the wire loop 20 (e.g. using the relative strength of the electromagnetic signal, for example, of its magnetic field component).

As noted above, where the object 50 is a robotic lawnmower, the wire loop 20 may, for example, indicate to the robot the path of at least part of a boundary of an area to be mowed (e.g. at least a part of the edge of a lawn). In such a case the processor(s) 102 of the receiving system 100 may be programmed so as to determine the location of the robot 50 relative to the boundary of the area to be mowed, using the electromagnetic signals received from the wire loop 20.

Further Modifications and Variations

It should be understood that the examples of demarcating systems and robotic systems presented above are merely illustrative and that a wide variety of variations and modifications of such examples are possible without departing from the principles of the present invention.

The invention claimed is:

1. A demarcating system for indicating a boundary of an area to an object, the object having a receiver for receiving electromagnetic signals, the system comprising:
a non-transitory machine-readable medium configured to store instructions; and
one or more processors configured to execute the instructions to:
control a signal generator to apply voltage signals to a wire loop, thereby causing the emission of corresponding electromagnetic boundary indicating signals from the wire loop for receipt by the receiver of the object;
analyze current signals present within the wire loop, wherein the current signals are sensed via current sensing circuitry that is electrically connected to the wire loop to sense the current signals present within the wire loop; and
operate in a calibration mode to:
cause the signal generator to apply a series of test voltage waveforms to the wire loop, each of the test voltage waveforms generating a corresponding current waveform within the wire loop; and
analyze the series of corresponding current waveforms, as sensed by the current sensing circuitry, to determine an operating voltage waveform that, when applied to the wire loop, generates a corresponding operating current waveform,
wherein a complete cycle of a predetermined current waveform comprises a number of positive peaks and a number of negative peaks, the number of positive peaks being different than the number of negative peaks, and
wherein a complete cycle of the corresponding operating current waveform comprises the number of positive peaks and the number of negative peaks.

2. The demarcating system according to claim 1, wherein the operating current waveform has the same amplitude as the predetermined current waveform.

3. The demarcating system according to claim 1, wherein each of the series of test voltage waveforms is sinusoidal and has a respective frequency.

4. The demarcating system according to claim 1, wherein the predetermined current waveform is bipolar and polarity asymmetric.

5. The demarcating system according to claim 1, wherein the object is a robot.

6. The demarcating system according to claim 1, wherein the predetermined current waveform is representable as a superposition of n sinusoidal current waveforms, each having a respective frequency $f_k$, phase shift $\theta_k$, and amplitude value $B_k$; and wherein the operating voltage waveform is representable as a superposition of n sinusoidal voltage waveforms, each having a respective phase shift $\psi_k$, and amplitude value $A_k$ and having the same frequency $f_k$ as a respective one of the n sinusoidal current waveforms; and wherein n is less than or equal to 10.

7. The demarcating system according to claim 1, wherein the predetermined current waveform is representable as a superposition of n sinusoidal current waveforms, each having a respective frequency $f_k$ and phase shift $\theta_k$; and wherein the series of test voltage waveforms comprises m sinusoidal test voltage waveforms, each with the same frequency, $f_k$, as a respective one of the n sinusoidal current waveforms.

8. The demarcating system according to claim 7, wherein analyzing the series of corresponding current waveforms comprises determining the phase difference between each test voltage waveform and its corresponding current waveform, thereby providing a corresponding series of phase difference values, $\Phi_1 \ldots \Phi_m$.

9. The demarcating system according to claim 8, wherein the operating voltage waveform is representable as a superposition of n sinusoidal voltage waveforms; and wherein each of the n sinusoidal voltage waveforms of the operating voltage waveform has the same frequency, $f_k$, as a corresponding one of the n sinusoidal current waveforms of the predetermined current waveform, and has a phase shift that is a combination of the phase shift, $\theta_k$, of that one of the n sinusoidal current waveforms, less the phase difference value, $\Phi_k$, associated with the test voltage waveform having the same frequency $f_k$.

10. The demarcating system according to claim 8, wherein analyzing the series of corresponding current waveforms comprises determining, for each test voltage waveform $v_k(t)$, the ratio between its amplitude $a_k$ and that of its corresponding current waveform $i_k(t)$, thereby providing a corresponding series of impedance values $Z_k$.

11. The demarcating system according to claim 10, wherein each of the n sinusoidal current waveforms of the predetermined current waveform l(t) has a respective amplitude value, $B_k$; and wherein each of the n sinusoidal voltage waveforms of the operating voltage waveform has a frequency $f_k$ and an amplitude that is substantially proportional to, and substantially equal to, the product of: the impedance value, $Z_k$, associated with the test voltage waveform $v_k(t)$ having the same frequency, $f_k$; and the amplitude value, $B_k$, for the sinusoidal current waveform having the same frequency.

12. The demarcating system according to claim 1, wherein each of the series of test voltage waveforms has substantially a same shape, but a different respective frequency, the frequencies of the series of test voltage waveforms being distributed over a frequency range;

wherein analyzing the series of corresponding current waveforms comprises determining a resonant frequency, $f_0$ within the frequency range;

wherein the resonant frequency is such that a voltage waveform of substantially the same shape as the test waveforms and having the resonant frequency will generate a corresponding current waveform having a maximum amplitude as compared with current waveforms that are generated by voltage waveforms of the same shape as the test waveforms and have other frequencies within the frequency range.

13. The demarcating system according to claim 12, wherein analyzing the series of corresponding current waveforms further comprises determining an impedance at the resonant frequency, $f_0$.

14. The demarcating system according to claim 1, wherein each of the series of test voltage waveforms is substantially sinusoidal and has a respective frequency, the frequencies of the series of test voltage waveforms being distributed over a frequency range; and wherein analyzing the series of corresponding current waveforms comprises determining a resonant frequency, $f_0$, within the frequency range, a sinusoidal voltage waveform having the resonant frequency generating a corresponding current waveform having the maximum amplitude as compared with current waveforms generated by sinusoidal voltage waveforms with other frequencies within the frequency range.

15. The demarcating system according to claim 14, wherein analyzing the series of corresponding current waveforms further comprises determining an impedance at the resonant frequency, $f_0$.

16. The demarcating system according to claim 15, wherein the predetermined current waveform are representable as a superposition of n sinusoidal current waveforms, each having a respective frequency $f_k$ and phase shift $\theta_k$; and wherein the operating voltage waveform are representable as a superposition of n sinusoidal voltage waveforms; and wherein each of the sinusoidal voltage waveforms has the same frequency, $f_k$, as a corresponding one of the plurality of sinusoidal current waveforms and has a phase shift that is a combination of the phase shift of that sinusoidal current waveform, $\theta_k$, and an additional phase shift value, $\Phi_k$, wherein the instructions, when executed, further cause the one or more processors to determine $\Phi_k$ based on: the frequency of that sinusoidal current waveform, $f_k$; the resonant frequency, $f_0$, and one or more values corresponding to the other sources of resistance and/or capacitance within the same circuit as the wire loop.

17. The demarcating system according to claim 16, wherein each impedance value, $Z(f_k)$, as determined by the one or more processors, is additionally based on the impedance, $Z(f_0)$, at the resonant frequency, $f_0$.

18. The demarcating system according to claim 16, wherein all of the sources of resistance within the same circuit as the wire loop are able to be approximated as a single source of resistance having a resistance R;

wherein all of the sources of capacitance within the same circuit as the wire loop are able to be approximated as a single source of capacitance in series with the wire loop and having a capacitance C; and wherein each of the additional phase shift values is substantially equal to:

$$\tan^{-1}\left(\frac{f_0^2 - f^2}{2\pi f_0^2 fRC}\right).$$

19. The demarcating system according to claim 18, wherein analyzing the series of corresponding current waveforms further comprises determining the impedance, $Z(f_0)$, at the resonant frequency, $f_0$; and wherein the resistance R is taken as being equal to the impedance, $Z(f_0)$, at the resonant frequency, $f_0$.

20. The demarcating system according to claim 16, wherein each of the plurality of sinusoidal current waveforms of the predetermined current waveform has a respective amplitude value $B_k$; and wherein each of the sinusoidal voltage waveforms of the operating voltage waveform has an amplitude that is substantially proportional to, and substantially equal to, the product of: an impedance value, $Z_k$, calculated for a sinusoidal voltage waveform having the same frequency, $f_k$, and the amplitude value, $B_k$, for the sinusoidal current waveform having the same frequency, $f_k$; and wherein the instructions, when executed, further cause the one or more processors to determine each impedance value $Z(f_k)$ based on: the frequency, $f_k$, of the sinusoidal voltage waveform in question; the resonant frequency, $f_0$, and one or more values corresponding to the other sources of resistance and/or capacitance within the same circuit as the wire loop.

21. The demarcating system according to claim 20, wherein all of the sources of resistance within the same circuit as the wire loop are able to be approximated as a single source of resistance having a resistance R;

wherein all of the sources of capacitance within the same circuit as the wire loop are able to be approximated as a single source of capacitance in series with the wire loop and having a capacitance C; and wherein each impedance value $Z(f_k)$ is substantially equal to:

$$\sqrt{R^2 + \left(\frac{f_0^2 - f_k^2}{2\pi f_0^2 f_k C}\right)^2}.$$

* * * * *